United States Patent
Kim et al.

(10) Patent No.: US 11,604,596 B2
(45) Date of Patent: Mar. 14, 2023

(54) STORAGE DEVICE AND OPERATING METHOD THEREOF

(71) Applicant: SK hynix Inc., Icheon-si (KR)

(72) Inventors: Tae Ha Kim, Icheon-si (KR); Jee Yul Kim, Icheon-si (KR); Hyeong Ju Na, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/328,697

(22) Filed: May 24, 2021

(65) Prior Publication Data

US 2022/0147261 A1 May 12, 2022

(30) Foreign Application Priority Data

Nov. 12, 2020 (KR) .................. 10-2020-0150828

(51) Int. Cl.
*G06F 3/06* (2006.01)
(52) U.S. Cl.
CPC .......... *G06F 3/0647* (2013.01); *G06F 3/0604* (2013.01); *G06F 3/0656* (2013.01); *G06F 3/0679* (2013.01)
(58) Field of Classification Search
CPC ..... G06F 3/0647; G06F 3/0604; G06F 3/0656
See application file for complete search history.

(56) References Cited

U.S. PATENT DOCUMENTS

| | | | |
|---|---|---|---|
| 11,354,235 B1 * | 6/2022 | Kuzmin | .............. G06F 12/0246 |
| 2019/0287567 A1 | 9/2019 | Segawa et al. | |
| 2022/0129055 A1 * | 4/2022 | Yang | .................. G06F 11/1448 |

FOREIGN PATENT DOCUMENTS

KR 20200011832 A 2/2020

* cited by examiner

*Primary Examiner* — Edward J Dudek, Jr.
(74) *Attorney, Agent, or Firm* — Perkins Coie LLP

(57) ABSTRACT

A storage device may include: a memory device including a plurality of memory blocks; a buffer memory device to store event information; and a memory controller configured to: upon occurrence of the predetermined event while a write operation, store, in the buffer memory device, the event information for the event page, and control the memory device to perform a test read operation to read at least one page in the plurality of memory blocks except the event page, based on the event information; upon failure of the test read operation, control the memory device to perform a migration operation of moving, to a replacement block, data stored in valid pages except a page on which the test read operation has fails among pages included in a memory block on which the test read operation fails.

19 Claims, 16 Drawing Sheets

STORAGE DEVICE AND OPERATING METHOD THEREOF

CROSS-REFERENCE TO RELATED APPLICATION

This patent document claims the priority and benefits of the Korean patent application number 10-2020-0150828, filed on Nov. 12, 2020, which is incorporated herein by reference in its entirety.

TECHNICAL FIELD

The technology disclosed in this patent document generally relates to an electronic device, and more particularly, to a storage device and an operating method thereof.

BACKGROUND

A storage device is used to store data under the control of a host device such as a computer or a smart phone. The storage device may include a memory device for storing data and a memory controller for controlling the memory device. The memory device is classified into a volatile memory device and a nonvolatile memory device.

The volatile memory device only retains its data while the device is powered and loses its data when power is lost. The volatile memory device may include, for example, a Static Random Access Memory (SRAM) and a Dynamic Random Access Memory (DRAM).

The nonvolatile memory device retains stored data even in the absence of power supply and thus does not lose its data when power is lost. The nonvolatile memory device may include, for example, a Read Only Memory (ROM), a Programmable ROM (PROM), an Electrically Programmable ROM (EPROM), an Electrically Erasable ROM (EEROM), and a flash memory.

SUMMARY

The embodiments of the disclosed technology relate to a storage device than can improve a media scan operation and an operating method of the storage device.

In an aspect of the disclosed technology, a storage device is disclosed. The storage device may include a memory device including a plurality of memory blocks for storing data; a buffer memory device configured to store event information that is associated with a predetermined event occurred includes address information of an event page in the plurality of memory blocks that are associated with the predetermined event occurred; and a memory controller configured to: upon occurrence of the predetermined event while a write operation is being performed on the plurality of memory blocks, store, in the buffer memory device, the event information for the event page, and control the memory device to perform a test read operation to read at least one page in the plurality of memory blocks except the event page, based on the event information; and upon failure of the test read operation, control the memory device to perform a migration operation of moving, to a replacement block, data stored in valid pages except a page on which the test read operation has fails among pages included in a memory block on which the test read operation failed.

In another aspect of the disclosed technology, a method for operating a storage device is disclosed. The method may include a plurality of memory blocks, the method including: upon occurrence a predetermined event while a write operation is being performed in the plurality of memory blocks, storing event information including address information of an event page associated with the predetermined event occurred; performing a test read operation to read at least one page in the plurality of memory blocks except the event page, based on the event information; and upon failure of the test read operation, performing a migration operation to move, to a replacement block, data stored in valid pages except a page in the plurality of memory blocks that has failed the test read operation.

In another aspect of the disclosed technology, a storage device is disclosed. The storage device may include a memory device including a plurality of memory blocks; a buffer memory device in communication with the memory device, and including a bitmap for storing event information associated with the plurality of memory blocks; and a memory controller in communication with the memory device and the buffer memory device and configured to read at least one page among a plurality of pages included in the plurality of memory blocks, based on the bitmap, and control the memory device to perform a media scan operation to move stored data, based on a read result, wherein, upon occurrence of an event that results in a suspension of a program operation, the memory controller controls the buffer memory device to store, in the bitmap, event information representing a page involving the event.

In another aspect of the disclosed technology, a data storage device may include a memory device including a plurality of memory blocks for storing data, a buffer memory device coupled to and in communication with the memory device and configured to store data including event information that is associated with a predetermined event occurred includes address information of a first page in the plurality of memory blocks that are associated with the predetermined event occurred, and a memory controller coupled to and in communication with the memory device and the buffer memory device and configured to upon occurrence of the predetermined event while a write operation is being performed on the plurality of memory blocks, store, in the buffer memory device, the event information on the first page, and control the memory device to perform a test read operation to read at least one page in the plurality of memory blocks except the first page, based on the event information, and upon failure of the test read operation, control the memory device to perform a migration operation to move, to a replacement block, data stored in valid pages included in the plurality of memory blocks except the at least one page on which the test read operation has failed.

In another aspect of the disclosed technology, a method for operating a data storage device including a plurality of memory blocks may comprise upon occurrence a predetermined event while a write operation is being performed in the plurality of memory blocks, storing event information including address information of a first page associated with the predetermined event occurred, performing a test read operation to read at least one page in the plurality of memory blocks except the first page, based on the event information, and upon failure of the test read operation, performing a migration operation to move, to a replacement block, data stored in valid pages except a page in the plurality of memory blocks that has failed the test read operation.

In another aspect of the disclosed technology, a storage device may include a memory device including a plurality of memory blocks, a buffer memory device in communication with the memory device, and including a bitmap for storing event information associated with the plurality of memory blocks, and a memory controller in communication with the memory device and the buffer memory device and configured to read at least one page among a plurality of pages included in the plurality of memory blocks, based on the bitmap, and control the memory device to perform a media scan operation to move stored data, based on a read result, wherein, upon occurrence of an event that results in a suspension of a program operation, the memory controller controls the buffer memory device to store, in the bitmap, event information representing a page involving the event.

In another aspect of the disclosed technology, a storage device may include a memory device including a plurality of memory blocks; a buffer memory device configured to store event information representing event pages respectively included in the plurality of memory blocks; and a memory controller configured to: when an even occurs in a state in which storage of data in the plurality of memory blocks is not completed, store event information on an event page as a page in which the event occurs in the buffer memory device, and control the memory device to perform a test read operation of reading at least one page among the other pages except the event page among a plurality of pages respectively included in the plurality of memory blocks, based on the event information; and when the test read operation fails, control the memory device to perform a migration operation of moving, to a replacement block, data stored in valid pages except a page on which the test read operation fails among pages included in a memory block on which the test read operation fails In another aspect of the disclosed technology, a method for operating a storage device including a plurality of memory blocks, the method may comprise, when an event occurs in a state in which storage of data in the plurality of memory blocks is not completed, storing event information on an event page in which the event occurs; performing a test read operation of reading at least one page among the other pages except the event page among a plurality of pages respectively included in the plurality of memory blocks, based on the event information; and when the test read operation fails, performing a migration operation of moving, to a replacement block, data stored in valid pages except a page on which the test read operation fails among pages included in a memory block on which the test read operation fails.

In another aspect of the disclosed technology, a storage device may include a memory device including a plurality of memory blocks; a buffer memory device including a bitmap for storing event information on the plurality of memory blocks; and a memory controller configured to read at least one page among pages included in the plurality of memory blocks, based on the bitmap, and control the memory device to perform a media scan operation of moving stored data, based on a read result, wherein, when an event in which a program operation is suspended occurs, the memory controller controls the buffer memory device to store, in the bitmap, event information representing a page corresponding to the event.

DETAILED DESCRIPTION

The embodiments of the disclosed technology provides an improved media scan operation that can be performed to detect and correct errors in storage device. The disclosed technology can be implemented in some embodiments to reduce or minimize unnecessary media scan operations.

Figure 1:
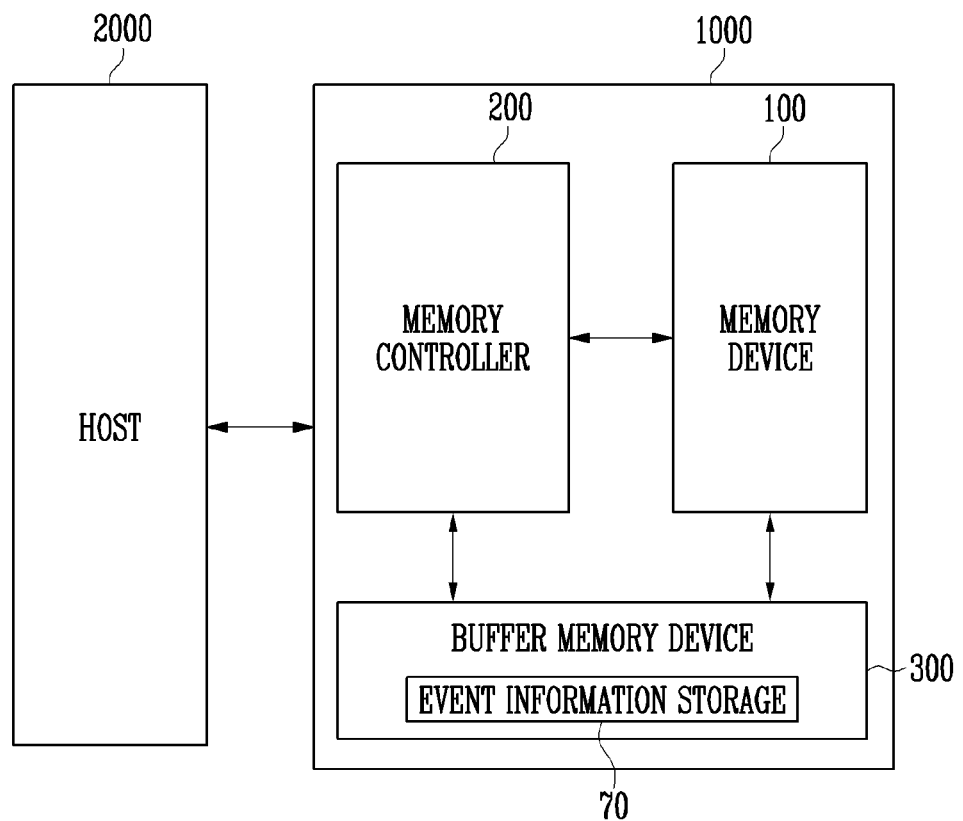
FIG. 1 is a block diagram illustrating a storage device based on an embodiment of the disclosed technology.

FIG. 1 is a block diagram illustrating a storage device based on an embodiment of the disclosed technology. In this patent document, the term "storage device" is used to indicate a data storage device.

Referring to FIG. 1, the storage device 1000 may include a memory device 100, a memory controller 200, and a buffer memory device 300.

The storage device 1000 may be a device for storing data under the control of a host 2000, such as a mobile phone, a smart phone, an MP3 player, a laptop computer, a desktop computer, a game console, a display device, a tablet PC or an in-vehicle infotainment.

The storage device 1000 may be manufactured as any one of various types of storage devices according to a host interface that is a communication scheme with the host 2000. For example, the storage device 1000 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 1000 may be implemented as any one of various kinds of package types. For example, the storage device 1000 may be implemented as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data. The memory device 100 operates under the control of the memory controller 200. Also, the memory device 100 may include a plurality of memory dies, and each of the plurality of memory dies may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells, and one memory block may include a plurality of pages. The page may be a unit for storing data in the memory device 100 or reading data stored in the memory device 100.

The memory device 100 may be implemented as a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetic Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 may receive a command and an address from the memory controller 200. The memory device 100 may access an area selected by the received address in the memory cell array. By accessing the selected area, the memory device 100 performs an operation corresponding to the received command on the selected area. For example, the memory device 100 may perform a write operation (program operation), a read operation, and an erase operation. The program operation may be an operation in which the memory device 100 records data in the area selected by the address. The read operation may include an operation in which the memory device 100 reads data from the area selected by the address. The erase operation may include an operation in which the memory device 100 erases data stored in the area selected by the address.

In an embodiment of the disclosed technology, the memory device 100 may perform a media scan operation to detect and correct errors in the stored data under the control of the memory controller 200. In some implementations, the memory device 100 may randomly select one or more word lines of a target block (e.g., target memory block) included in the memory device 100 and perform a test read on data stored in a page corresponding to the selected word line under the control of the memory controller 200. When the test read of the page fails as a result of the test read, the memory device 100 may move, to a replacement block, data stored in the other pages except the test-read-failed page among a plurality of pages included in the target block. That is, in order to ensure data stored in the memory device 100, the media scan operation is performed as a background operation under the control of the memory controller 200, regardless of any requests from the host 2000. In some implementations, the media scan operation can be performed during idle time to check the memory area in the memory device 100. In some implementations, the media scan operation includes a read operation of a memory block to determine whether an uncorrectable error (e.g., uncorrectable ECC error) occurs. Upon determining that an uncorrectable error has occurred, a read refresh operation can be performed to move, to a free memory block, data that has been successfully read.

The memory controller 200 may control overall operations of the storage device 1000.

When the storage device 1000 is activated, the memory controller 200 may execute firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000, and translate the LA into a Physical Address (PA) representing an address of memory cells in which data included in the memory device 100 is to be stored. The LA may be a Logical Block Address (LBA), and the PA may be a Physical Block Address (PBA).

The memory controller 200 may control the memory device 100 to perform a program operation, a read operation, an erase operation, or the like in response to a request from the host 2000. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any requests from the host 2000. For example, the memory controller 200 may control the memory device 100 to perform a program operation, a read operation, or an erase operation, which is used to perform a background operation such as wear leveling, garbage collection, or read reclaim.

In an embodiment of the disclosed technology, the memory controller 200 may control the memory device 100 to autonomously perform a media scan operation regardless of any requests from the host 2000. The media scan operation may be configured with a read operation and a program operation. Specifically, the media scan operation may be an operation in which the memory controller 200 controls the memory device 100 to read data stored in a specific memory block regardless of any requests from the host 2000, and controls the memory device 100 to move, to another open block, data stored in the other pages except a page in which read fail occurs, when the read fail occurs in the specific memory block.

In an embodiment of the disclosed technology, the buffer memory device 300 may include an event information storage 70. The event information storage 70 may store event information that can be used to locate pages in a plurality of memory blocks that are associated with a predetermined event occurred. In this patent document, such pages are referred to as "event pages." In some implementations, the memory controller 200 may store, in the event information storage 70, a bitmap that maps one or more bits to each of the plurality of memory blocks. In one example, the memory controller 200 may store, in the event information storage 70, a bitmap in which n bits are allocated to each of the plurality of memory blocks included in the memory device 100. The event information storage 70 may include information for determining a target of the media scan operation. In one example, the memory controller 200 may acquire information on a word line or page to be excluded in the media scan operation, based on the event information stored in the buffer memory device 300, and determine a target block on which the media scan operation is to be performed among the plurality of memory blocks with reference to the event information. The media scan operation will be described in detail later with reference to FIGS. 5 to 10.

The host 2000 may communicate with the storage device 1000, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
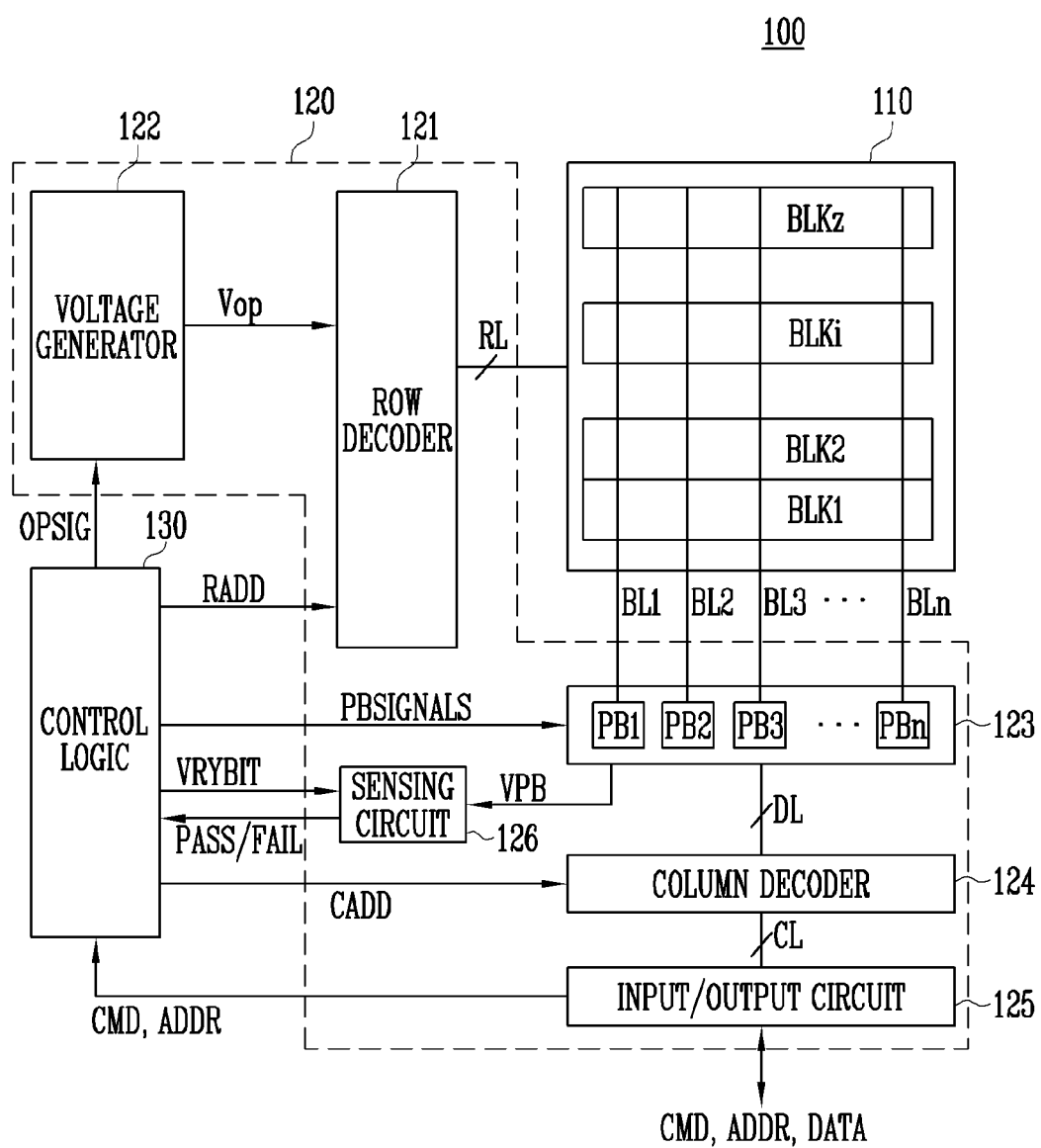
FIG. 2 is a block diagram illustrating a memory device based on an embodiment of the disclosed technology.

FIG. 2 is a block diagram illustrating a memory device based on an embodiment of the disclosed technology.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may be configured to perform a program operation, a read operation or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 may receive a row address RADD from the control logic 130. Specifically, the row decoder 121 may decode the row address RADD. The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and may apply a program pass voltage having a level lower than that of the program voltage to unselected word lines. In a program verify operation, the row decoder 121 may apply a verify voltage to the selected word line, and may apply a verify pass voltage higher than the verify voltage to the unselected word lines. In a read operation, the row decoder 121 may apply a read voltage to the selected word line, and may apply a read pass voltage higher than the read voltage to the unselected word lines.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory block.

The voltage generator 122 may operate under the control of the control logic 130. Specifically, the voltage generator 122 may generate a plurality of voltages by using an external power voltage supplied to the memory device 100 under the control of the control logic 130. For example, the voltage generator 122 may generate a program voltage, a verify voltage, a pass voltage, a read voltage, an erased voltage, and the like under the control of the control logic 130. That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages by using the external power voltage or the internal power voltage. For example, the voltage generator 122 may include a plurality of pumping capacitors for receiving the internal power voltage, and generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth page buffers PB1 to PBn may operate under the control of the control logic 130. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 126 may generate a reference current in response to an allow bit VRYBIT signal, and output a "pass" signal PASS or a "fail" signal FAIL by comparing a sensing voltage VPB received from the page buffer group 123 and a reference voltage generated by the reference current. In this patent document, the term "pass" can be used to indicate a program operation has succeeded, and the term "fail" can be used to indicate a program operation has failed.

The control logic 130 may control the peripheral circuit 120 by outputting the operation signal OPSIG, the row address RADD, the page buffer control signals PBSIG-NALS, and the allow bit VRYBIT in response to the command CMD and the address ADDR.

Also, the control logic 130 may determine whether the verify operation has passed or failed in response to the pass or fail signal PASS or FAIL. Also, the control logic 130 may control the page buffer group 123 to temporarily store verify information including the pass or fail signal PASS or FAIL in the page buffer group 123. Specifically, the control logic 130 may determine a program state of a memory cell in response to the pass or fail signal PASS or FAIL. For example, when the memory cell operates as a Triple Level Cell (TLC), the control logic 130 may determine whether the program state of the memory cell is any one of an erase state E or first to seventh program states P1 to P7.

Figure 3:
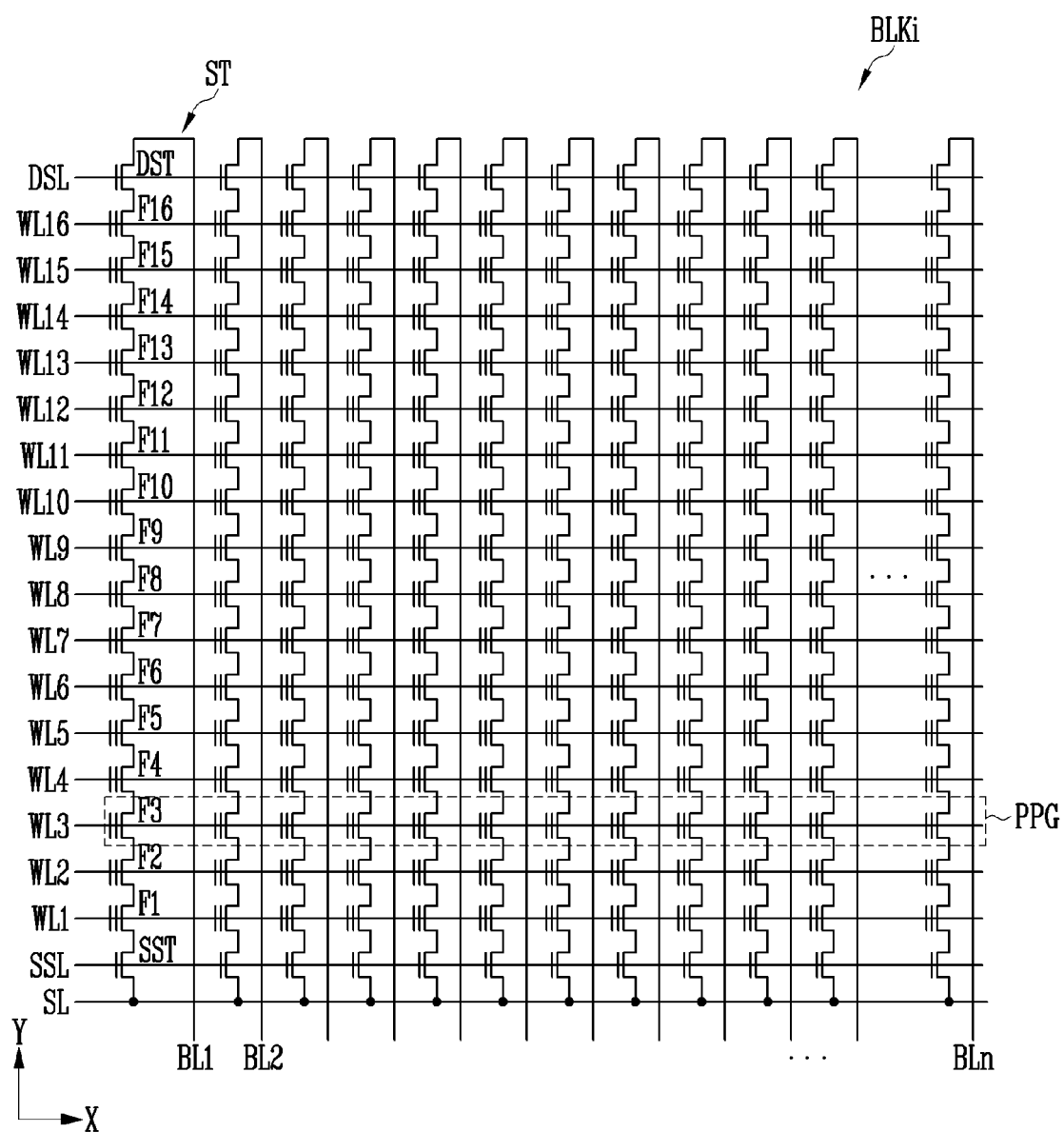
FIG. 3 is a diagram illustrating a memory block based on an embodiment of the disclosed technology.

FIG. 3 is a diagram illustrating a memory block based on an embodiment of the disclosed technology.

Referring to FIG. 3, in the memory block BLKi, a plurality of word lines arranged in parallel to each other may be connected between a first select line and a second select line. The first select line may be a source select line SSL, and the second select line may be a drain select line DSL. In some implementations, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The structures of the strings ST may be identical to one another, and therefore, a string ST connected to a first bit line BL1 will be described in detail as an example. In this patent document, the term "string" can be used to indicate a memory cell string that includes a plurality of memory cells coupled in series.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells F1 to F16 may be connected to a plurality of word lines WL1 to WL16. A group of memory cells connected to the same word line among memory cells included in different strings ST may be referred to as a physical page PPG. Therefore, physical pages PPG corresponding to the number of the word lines WL1 to WL16 may be included in the memory block BLKi.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The SLC may store one-bit data. One physical page PG of the SLC may store one logical page (LPG) data. The one LPG data may include data bits of which number corresponding to that of cells included in the one physical page PG.

The MLC, the TLC, and the QLC may store two or more-bit data. One physical page PG may store two or more LPG data.

Figure 4:
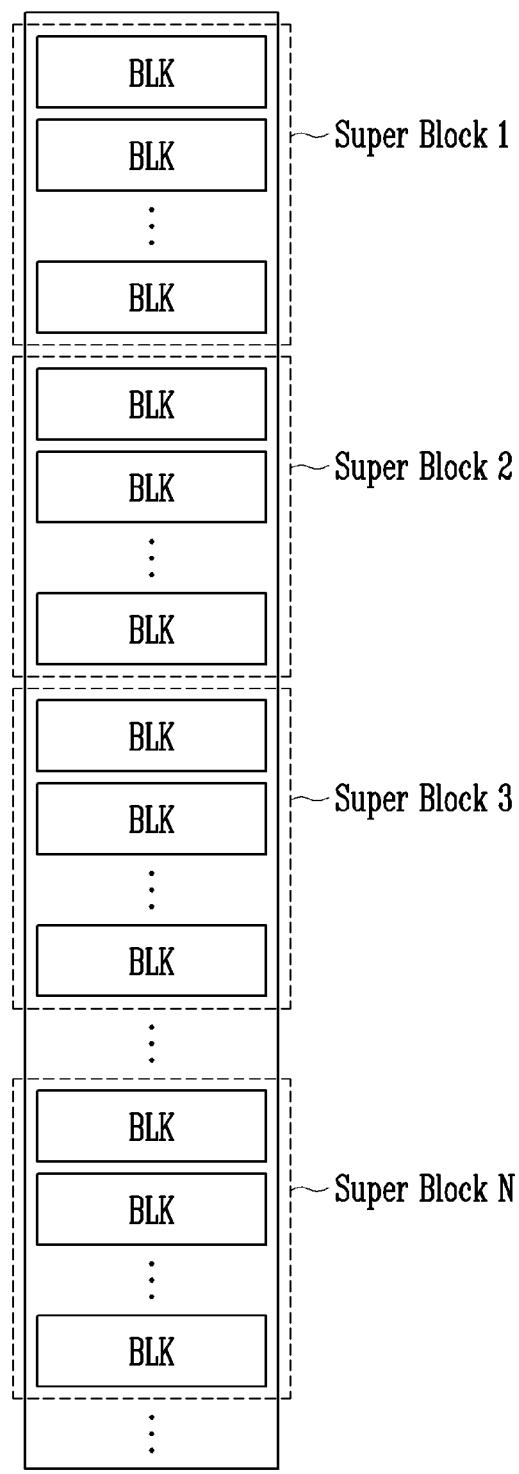
FIG. 4 is a diagram illustrating a super block based on an embodiment of the disclosed technology.

FIG. 4 is a diagram illustrating a super block based on an embodiment of the disclosed technology.

Referring to FIG. 4, each of a plurality of super blocks Super Block 1 to Super Block N may include a plurality of memory blocks BLK. For example, each of first to Nth super blocks Super Block 1 to Super Block N may include a plurality of memory blocks. Numbers of memory blocks respectively included in the plurality of super blocks Super Block 1 to Super Block N may be the same. Alternatively, based on an embodiment, numbers of memory blocks respectively included in the plurality of super blocks Super Block 1 to Super Block N may be different from each other according to an operation unit.

Specifically, the storage device 1000 may perform an internal operation in units of super blocks. For example, the memory controller 200 may control the memory device 100 to store data in units of super blocks. The memory controller 200 may control the memory device 100 to store consecutive logical addresses in one super block. Also, the memory controller 200 may map logical addresses and physical addresses in units of super blocks.

Based on an embodiment of the disclosed technology, each of the plurality of super blocks Super Block 1 to Super Block N may correspond to a bitmap to which N bits are allocated. For example, each super block may correspond to a bitmap to which four bits are allocated per memory block. That is, in each of the plurality of super blocks Super Block 1 to Super Block N included in the memory device 100, each of the plurality of memory blocks may correspond to a bitmap to which four bits are allocated.

Figure 5:
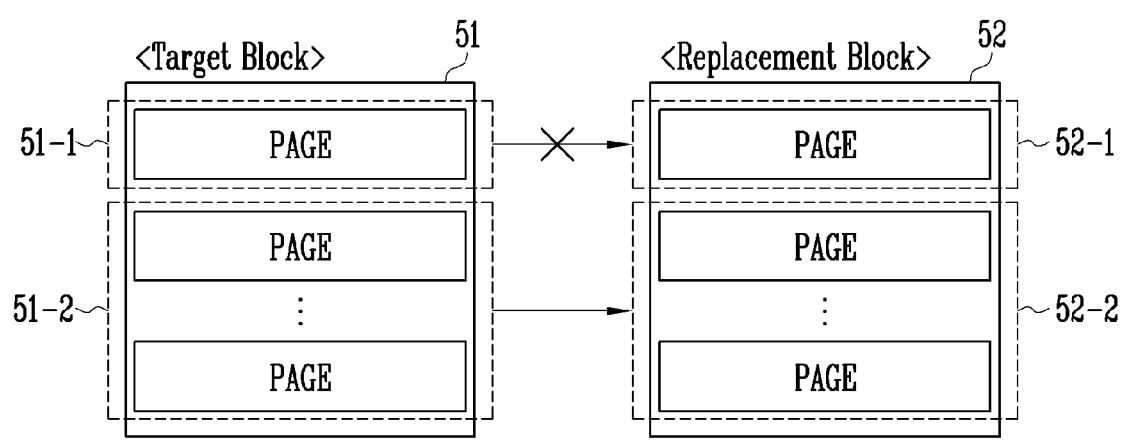
FIG. 5 is a diagram illustrating a media scan operation based on an embodiment of the disclosed technology.

FIG. 5 is a diagram illustrating a media scan operation based on an embodiment of the disclosed technology.

Referring to FIG. 5, a media scan operation of moving data stored in a target block 51 to a replacement block 52 is illustrated.

The media scan operation is an operation for ensuring the performance of the storage device and the reliability of data, and may be classified into a foreground media scan (FGMS) operating as a foreground operation according to a request from the host 2000 and a background media scan (BGMS) operating as a background operation regardless of any requests from the host 2000. The media scan operation may perform a test read so as to ensure the performance of the storage device and the reliability of data, and perform a read defense operation such as read retry, eboost, or soft decoding, when the test read fails. In this specification, for convenience of description, a case where the read defense operation is a migration operation is assumed and described. In addition, the media scan operation may be applied to both a FGMS operation and a BGMS operation.

The storage device 1000 may perform the media scan operation including a test read operation of randomly reading data stored in the memory device 100 and a migration operation of moving the other data when the test read operation fails. Specifically, the storage device 1000 may perform the test read operation by determining, as a target block, an arbitrary memory block among a plurality of memory blocks. Also, when read fail occurs in a partial page of the target block, the storage device 1000 may perform the migration operation of moving, to a replacement block, data stored in the other pages except the partial page in which the read fail occurs.

For example, the storage device 1000 may randomly perform the test read operation on a partial page included in the target block 51, and the test read operation on the partial page may fail. Also, the storage device 1000 may move, to the replacement block 52, data stored in the other pages 51-2 except a fail page (51-1) on which the test read operation fails. The storage device 1000 may replace data stored in the fail page 51-1 with dummy data and store it in a corresponding replacement page 52-1, and store the data stored in the other pages 51-2 in replacement pages 52-2.

In the media scan operation, a read sensing processes may be generated 5 times to 30 times while the read defense operation is repeated, and an unnecessary read defense operation on a memory block having no error may cause overhead of the storage device 1000. A conventional media scan operation required an excessive memory capacity to prevent an unnecessary operation. However, based on the embodiment of the disclosed technology, the storage device 1000 can perform an improved media scan operation for preventing an unnecessary media scan operation by using a minimum capacity.

Figure 6:
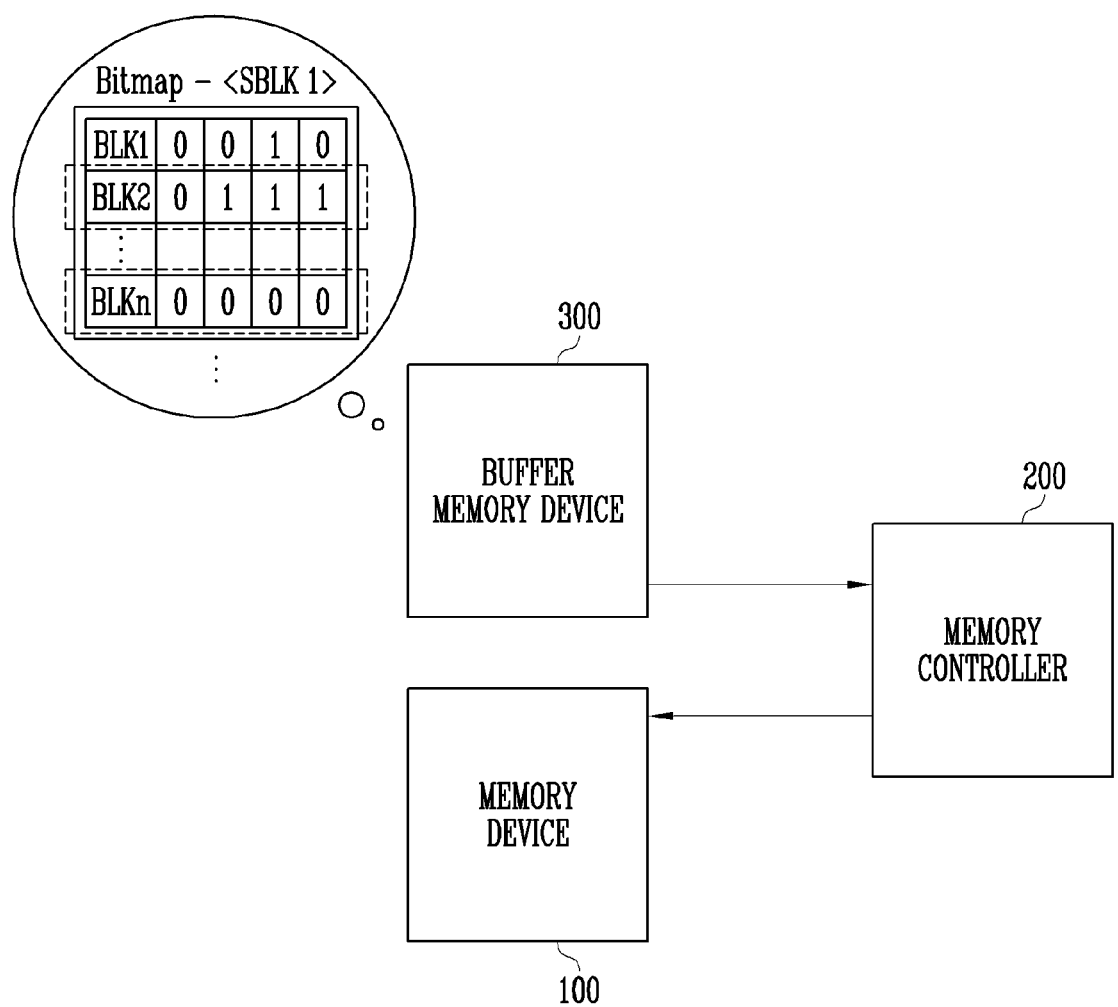
FIG. 6 is a diagram illustrating an operation of a memory controller based on an embodiment of the disclosed technology.

FIG. 6 is a diagram illustrating an operation of the memory controller based on an embodiment of the disclosed technology.

Referring to FIG. 6, the memory controller 200 for controlling the memory device 100 to prevent performing of an unnecessary media scan operation by using information stored in the buffer memory device 300 is illustrated.

When a test read operation is performed on an event page, a read defense operation may be performed even though post-processing (a repair operation on sudden power-off or partial close) associated with an event has been finished. Based on an embodiment of the disclosed technology, the memory controller 200 may determine a page to be excluded in the media scan operation by using event information, and prevent an unnecessary media scan operation by using the event information.

Specifically, when a predetermined event occurs while a write operation is being performed, the write operation is terminated abnormally. In such a situation, the memory controller 200 may control the buffer memory device 300 to store event information including an address of a page that is associated with the predetermined event occurred. The event may include sudden power-off or unexpected shutdown that can be caused by power outages, brown outs, depleted laptop battery, removed power cord, etc. The event may also include a partial closure of an open block in which the open block is closed after data written only to a portion of the open block. That is, the event may indicate a case in which data is not completely stored among close blocks on which the program operation is ended and is abnormally closed.

In addition, the buffer memory device 300 may store event information under the control of the memory controller 200. Specifically, the buffer memory device 300 may store the event information by using a bitmap corresponding to a plurality of memory blocks or a super block. The bitmap or the event information may include information which represents that an event page exists or presents a position of the event page.

The memory controller 200 may control the memory device 100 to perform the media scan operation with reference to the event information stored in the buffer memory device 300. Specifically, the memory controller 200 may control the memory device 100 to perform a test read operation of randomly reading a partial page among the other pages except event pages among a plurality of pages included in the plurality of memory blocks. Also, when the test read operation fails, the memory controller 200 may control the memory device 100 to perform a migration operation of moving, to a replacement block, data stored in the other pages except a page on which the test read operation fails in a memory block including the page on which the test read operation fails. Here, the replacement block may include a free block, an open block or any other block that is available for a program or write operation.

Figure 7:
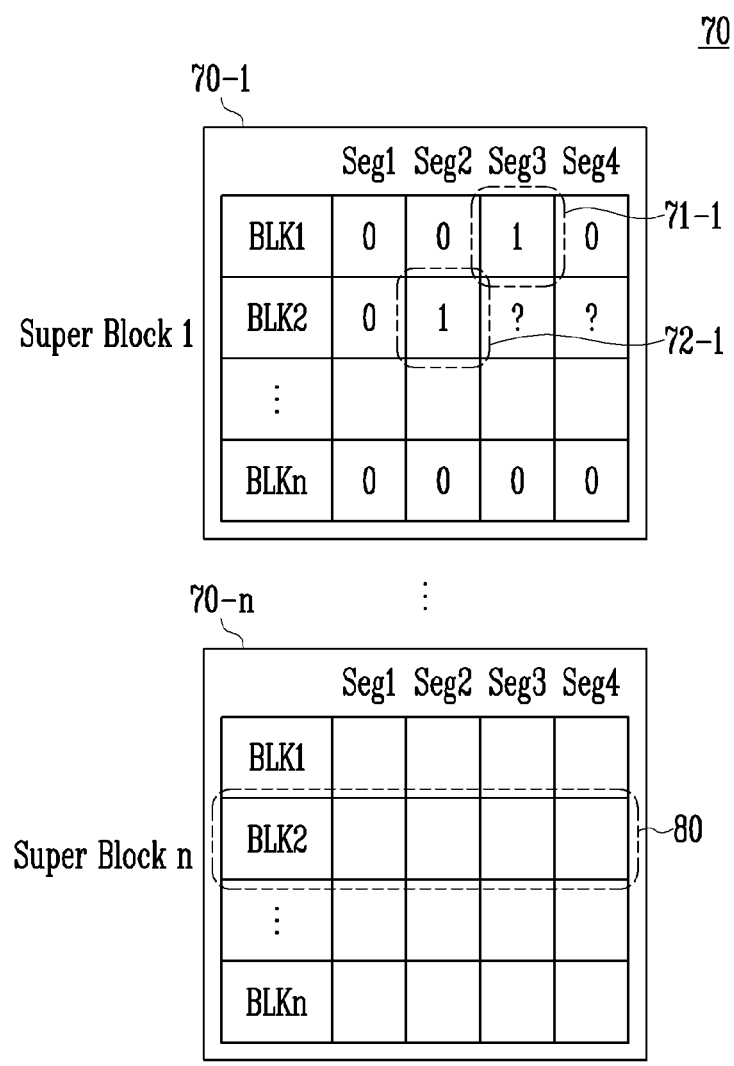
FIG. 7 is a diagram illustrating an event information storage based on an embodiment of the disclosed technology.

FIG. 7 is a diagram illustrating an event information storage based on an embodiment of the disclosed technology.

Referring to FIG. 7, the event information storage 70 included in the buffer memory device 300 is illustrated. The buffer memory device 300 may include the event information storage 70 including a bitmap to which n bits are allocated for each of the plurality of memory blocks. In addition, the bitmap included in the event information storage 70 may be configured in units of super blocks. For example, the event information storage 70 may include a first bitmap 70-1 corresponding to a first super block to an nth bitmap 70-n corresponding to an nth super block. In addition, the first bitmap 70-1 corresponding to the first super block may include information corresponding to first to nth memory blocks BLK1 to BLKn, and the nth bitmap 70-n corresponding to the nth super block may include information corresponding to first to nth memory blocks BLK1 to BLKn.

Referring to the first bitmap 70-1, the first bitmap 70-1 may include a plurality of segments to which a plurality of word lines are allocated for each memory block. For example, a plurality of word lines connected to the first memory block BLK1 may be mapped to first to fourth segments Seg1 to Seg4. Similarly, a plurality of word lines included in the nth memory block BLKn may be mapped to first to fourth segments Seg1 to Seg4.

Since each segment is mapped to a plurality of word lines of a corresponding memory block, the event information storage 70 may store event information by using a segment to which an event page corresponding to an event belongs. The event information may be information representing that an event page exists, or information representing a position of the event page. The buffer memory device 300 may represent that an event page exists in a plurality of word lines or a plurality of pages, which correspond to each segment, by storing a bit corresponding to the corresponding segment as a set state or 1.

Referring to bits corresponding to the first memory block BLK1, since a bit corresponding to the first segment Seg1, a bit corresponding to the second segment Seg2, and a bit corresponding to the fourth segment Seg4 are 0, the memory controller 200 may acquire information representing that any event page does not exist in a plurality of word lines or a plurality of pages, which correspond to the first segment Seg1, the second segment Seg2, and the fourth segment Seg4 of the first memory block BLK1. On the other hand, since a bit 71-1 corresponding to the third segment Seg3 of the first memory block BLK1 and a bit 72-1 corresponding to the second segment Seg2 of the second memory block BLK2 are 1, the memory controller 200 may acquire information representing that an event page exists in a plurality of word lines or a plurality of pages, which correspond to the third segment Seg3 of the first memory block BLK1 and the second segment Seg2 of the second memory block BLK2.

Although a case where the event information is represented by using four bits per memory block has been illustrated in FIG. 7, the event information may be implemented with bits greater or smaller than the four bits per memory block.

Figure 8:
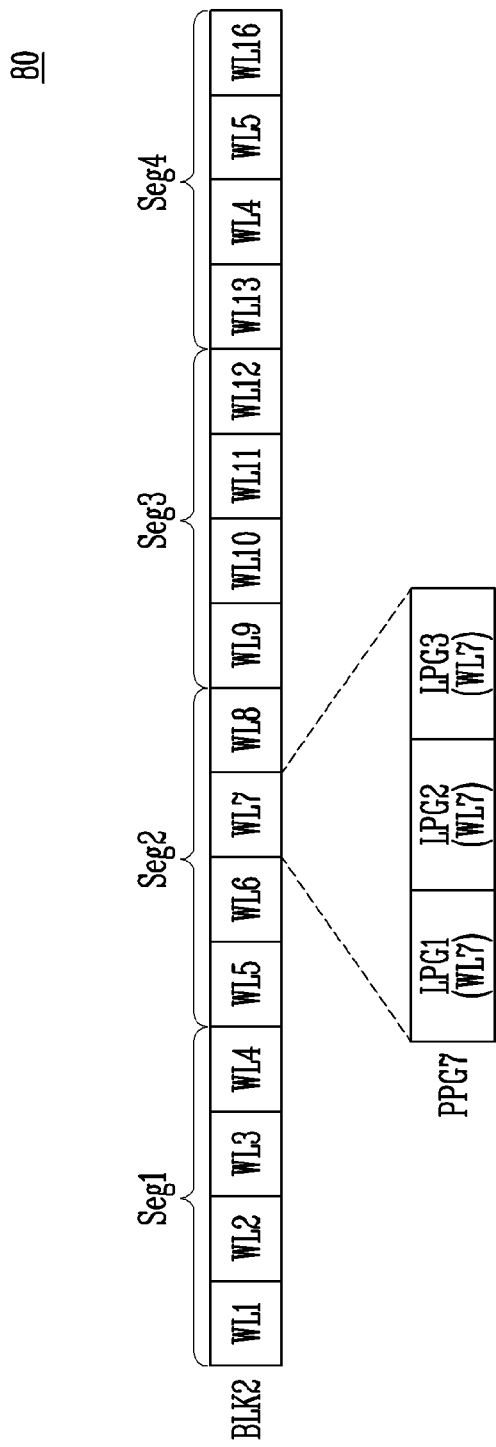
FIG. 8 is a diagram illustrating an event information storage based on an embodiment of the disclosed technology.

FIG. 8 is a diagram illustrating an event information storage based on an embodiment of the disclosed technology.

Referring to FIG. 8, a bitmap 80 corresponding to the second memory block BLK2 of the nth super block shown in FIG. 7 is illustrated. Although FIG. 8 shows the memory block as including 16 word lines and 4 segments, each corresponding to 4 word lines by way of example, the number of word lines and the number of segments may vary.

First to fourth word lines WL1 to WL4 may correspond to a first segment Seg1, fifth to eighth word lines WL5 to WL8 may correspond to a second segment Seg2, ninth to twelfth word lines WL9 to WL12 may correspond to a third segment Seg3, and thirteenth to sixteenth word lines WL13 to WL16 may correspond to a fourth segment Seg4.

In addition, when a memory cell is a Triple Level Cell (TLC), one word line may correspond to one physical page PPG or three logical pages LPG. For example, the seventh word line WL7 may correspond to a seventh physical page PPG7 or first to third logical pages LPG1 to LPG3.

In addition, the event information storage 70 may store event information by using a bit corresponding to a segment to which an event page belongs.

Figure 9:
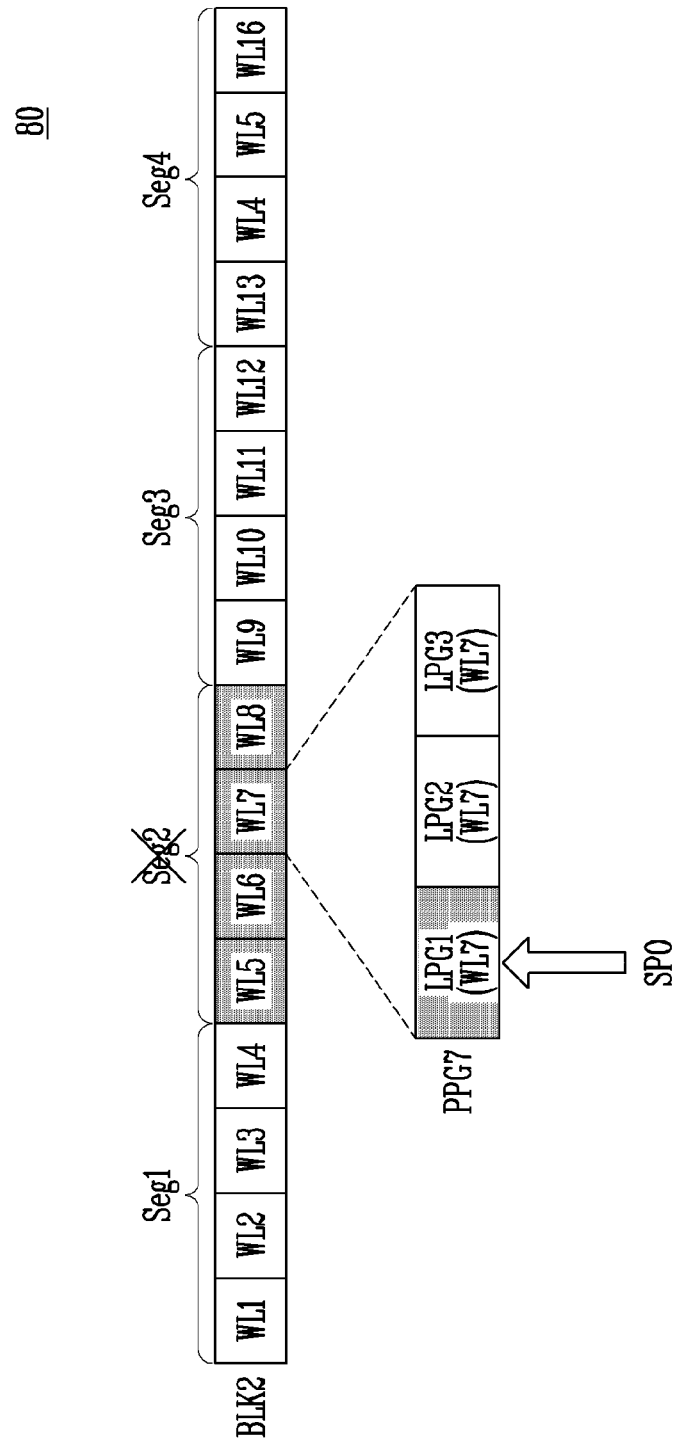
FIG. 9 is a diagram illustrating a method for storing event information based on an embodiment of the disclosed technology.

FIG. 9 is a diagram illustrating a method for storing event information based on an embodiment of the disclosed technology.

Referring to FIG. 9, a case where sudden power-off occurs during a program operation on a memory cell corresponding to the second segment Seg2 is illustrated. When sudden power-off in which a program operation is not completed but ended occurs, the memory controller 200 may control the buffer memory device to store event information on an event page corresponding to the sudden power-off. For example, when sudden power-off occurs while a program operation is being performed on a memory cell corresponding to the first logical page LPG1 of the seventh word line WL7 of the second memory block BLK2, the memory controller 200 may control the buffer memory device 300 to store event information on an event page corresponding to the sudden power-off. That is, the event information storage 70 may store the event information by storing a bit corresponding to the second segment Seg2 of the second memory block BLK2 as a set state or 1.

When sudden power-off in which a program operation is not completed but ended occurs, the memory controller 200 may control the buffer memory device 300 to store event information on a page on which the program operation has been performed lastly before the program operation is ended. For example, when the memory controller 200 request the memory device 100 of a media scan operation, the memory controller 200 may exclude word lines (e.g., the fifth to eighth word lines WL5 to WL8) corresponding to the second segment Seg2 of the second memory block BLK2 from targets of the media scan operation, with reference to the event information stored in the buffer memory device 300.

Figure 10:
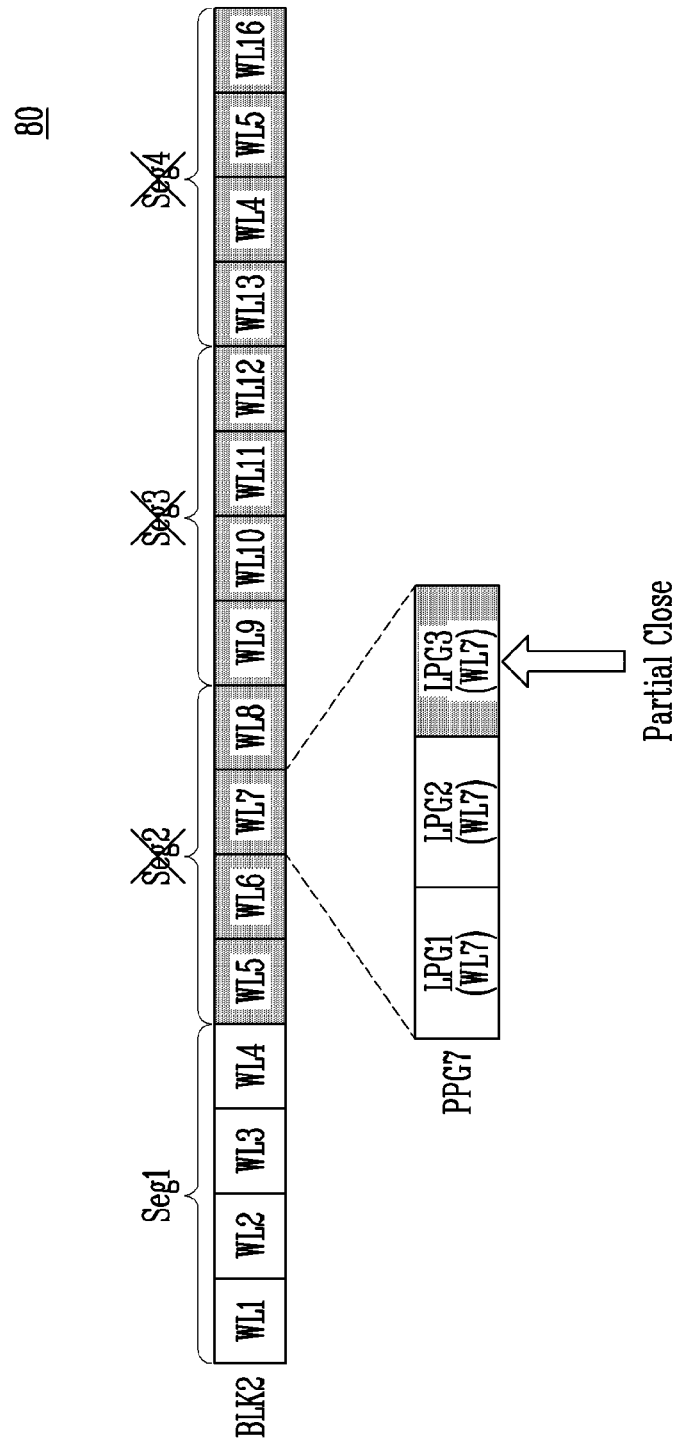
FIG. 10 is a diagram illustrating a method for storing event information based on an embodiment of the disclosed technology.

FIG. 10 is a diagram illustrating a method for storing event information based on an embodiment of the disclosed technology.

Referring to FIG. 10, a case where partial close occurs during a program operation on a memory cell corresponding to the second segment Seg2 is illustrated. When partial close in which a program operation is not completed but end occurs, the memory controller 200 may control the buffer memory device 300 to store event information on an event page corresponding to the partial close. When partial close occurs while a program operation is being performed on a memory cell corresponding to the third logical page LPG3 of the seventh word line WL7 of the second memory block BLK2, the memory controller 200 may control the buffer memory device 300 to store event information on an event page corresponding to the partial close. That is, the event information storage 70 may store the event information by storing bits corresponding to the second to fourth segments Seg2 to Seg4 of the second memory block BLK2 as a set state or 1.

In addition, when partial close in which a program operation is not completed but ended occurs, the memory controller 200 may control the buffer memory device 300 to store event information on a page on which the program operation has been performed lastly before the program operation is ended and subsequent pages. For example, when the memory controller 200 request the memory device 100 of a media scan operation, the memory controller 200 may exclude word lines (e.g., the fifth to sixteenth word lines WL5 to WL16) corresponding to the second to fourth segments Seg2 to Seg4 of the second memory block BLK2 from targets of the media scan operation, with reference to the event information stored in the buffer memory device 300.

Figure 11:
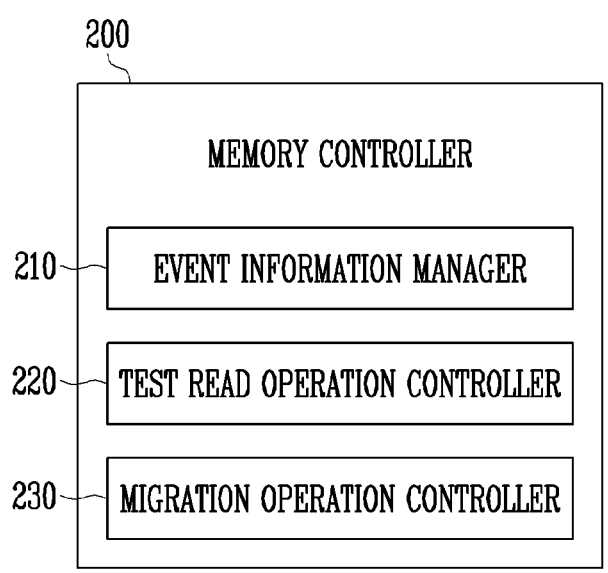
FIG. 11 is a block diagram illustrating a configuration of a memory controller based on an embodiment of the disclosed technology.

FIG. 11 is a block diagram illustrating a configuration of a memory controller based on an embodiment of the disclosed technology.

Referring to FIG. 11, the memory controller 200 may include an event information manager 210, a test read operation controller 230, and a migration operation controller 220.

The event information manager 210 may be a component for controlling the buffer memory device 300 to store event information. Specifically, when an event in which a program operation is not completed but ended occurs, the event information manager 210 may acquire address information corresponding to an event page, and control the buffer memory device to store event information corresponding to the address information.

The test read operation controller 220 may be a component for controlling the memory device 100 to perform a test read operation. Specifically, the test read operation controller 220 may control the memory device 100 to perform a test read operation of randomly determining a target block on which the test read operation is to be performed among a plurality of memory blocks included in the memory device 100, and randomly reading at least one page from the target block.

The migration operation controller 230 may be a component for controlling the memory device 100 to perform a migration operation. Specifically, the migration operation controller 230 may control the memory device 100 to perform a migration operation, based on a result obtained by performing the test read operation. When the test read operation fails, the migration operation controller 230 may control the memory device 100 to perform a migration operation of moving, to a replacement block, data stored in the other pages except a page of which the test read operation fails in the target block on which the test read operation is performed.

Figure 12:
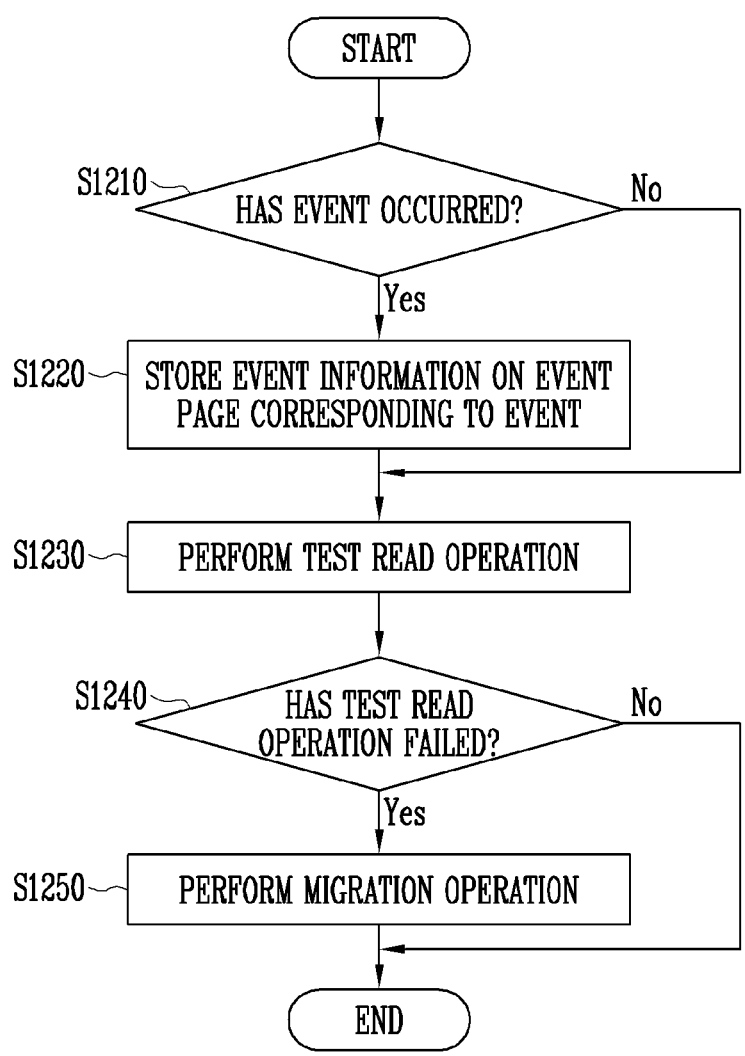
FIG. 12 is a flowchart illustrating an operating method of the storage device based on an embodiment of the disclosed technology.

FIG. 12 is a flowchart illustrating an operating method of the storage device based on an embodiment of the disclosed technology.

Referring to FIG. 12, an operating method of the storage device including a plurality of memory blocks is illustrated for each step.

The storage device 1000 may periodically perform a media scan operation, and an event in which a program operation is not completed but ended before the media scan operation is performed may occur (S1210).

When the event occurs (S1210, Yes), the storage device 1000 may store event information on an event page corresponding to the event (S1220). The event may include sudden power-off in which the supply of power is interrupted or partial close in which an open block is closed after data is stored in a portion of the open block. That is, the event may indicate a case in which data is not completely stored among closed blocks on which the program operation is ended and is abnormally closed. The event information may be information representing a position of the event page.

When the event does not occur (S1210, No) or after the storage device 1000 stores the event information, the storage device 1000 may perform a test read operation (S1230). Specifically, the storage device may perform a test read operation of randomly reading at least one page among the other pages except the event page among the plurality of memory blocks, based on the event information.

The storage device 1000 may determine whether the test read operation has failed (S1240). When the test read operation fails (1240, Yes), the storage device 1000 may perform a migration operation of moving, to a replacement block, data stored in the other pages except a page on which the test read operation fails in a memory block including the page on which the test read operation fails (S1250).

Based on an embodiment of the disclosed technology, the storage device 1000 may acquire address information corresponding to the event page, and store event information corresponding to the address information. Also, the storage device 1000 may store the event information by using a bitmap to which n bits are allocated for each of the plurality of memory blocks. The bitmap may include a plurality of segments to which a plurality of word lines are allocated for each of the plurality of memory blocks. Also, the storage device 1000 may store event information by using a segment to which an event page corresponding to an event belongs.

Also, when sudden power-off in which a program operation is not completed but ended occurs, the storage device 1000 may store event information on a page on which the program operation has been performed lastly before the program operation is ended.

Also, when partial close in which a program operation is not completed but ended occurs, the storage device 1000 may store event information on a page on which the program operation has been performed lastly before the program operation is ended and subsequent pages.

Figure 13:
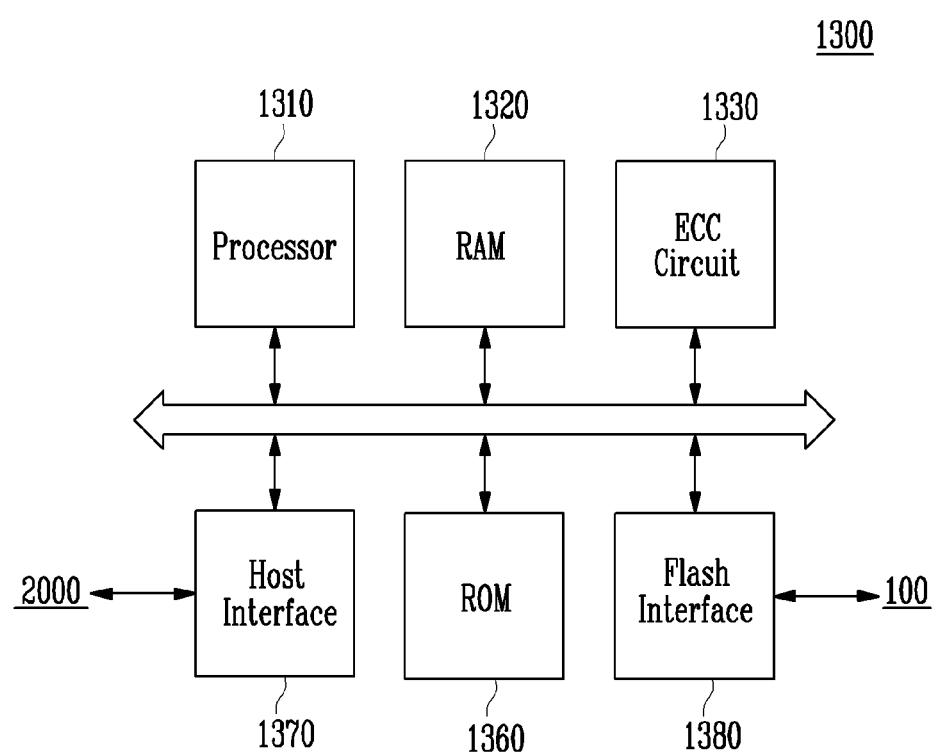
FIG. 13 is a block diagram illustrating a configuration of a memory controller based on another embodiment of the disclosed technology.

FIG. 13 is a block diagram illustrating a configuration of a memory controller based on another embodiment of the disclosed technology.

Referring to FIG. 13, the memory controller 1300 may include a processor 1310, a RAM 1320, and an ECC circuit 1330, a ROM 1360, a host interface 1370, and a flash interface 1380. The memory controller 1300 shown in FIG. 13 may be an embodiment of the memory controller 200 shown in FIG. 1.

The processor 1310 may communicate with the host 2000 by using the host interface 1370, and perform a logical operation to control an operation of the memory controller 1300. For example, the processor 1310 may load a program command, a data file, a data structure, etc., based on a request received from the host 2000 or an external device, and perform various operations or generate a command and an address. For example, the processor 1310 may generate various commands necessary for a program operation, a read operation, an erase operation, a suspend operation, and a parameter setting operation.

Also, the processor 1310 may perform a function of a Flash Translation Layer (FTL). The processor 250 may translate a Logical Block Address (LBA) provided by the host 2000 into a Physical Block Address (PBA) through the FTL. The FTL may receive an LBA input, to translate the LBA into a PBA by using a mapping table. Several address mapping methods of the FTL exist according to mapping units. A representative address mapping method includes a page mapping method, a block mapping method, and a hybrid mapping method.

Also, the processor 1310 may generate a command without any request from the host 2000. For example, the processor 1310 may generate a command for background operations such as operations for wear leveling of the memory device 100 and operations for garbage collection of the memory device 100.

The RAM 1320 may be used as a buffer memory, a working memory, or a cache memory of the processor 1310. Also, the RAM 1320 may store codes and commands, which the processor 1310 executes. The RAM 1320 may store data processed by the processor 1310. Also, the RAM 1320 may be implemented, including a Static RAM (SRAM) or a Dynamic RAM (DRAM).

The ECC circuit 1330 may detect an error in a program operation or a read operation, and correct the detected error. Specifically, the ECC circuit 1330 may perform an error correction operation according to an Error Correction Code (ECC). Also, the ECC circuit 1330 may perform ECC encoding, based on data to be written to the memory device 100. The data on which the ECC encoding is performed may be transferred to the memory device 100 through the flash interface 1380. Also, the ECC circuit 1330 may perform ECC decoding on data received from the memory device 100 through the flash interface 1380.

The ROM 1360 may be used as a storage unit for storing various information necessary for an operation of the memory controller 1300. Specifically, the ROM 1360 may include a map table, and physical-to-logical address information and logical-to-physical address information may be stored in the map table. Also, the ROM 1360 may be controlled by the processor 1310.

The host interface 1370 may include a protocol for exchanging data between the host 2000 and the memory controller 1300. Specifically, the host interface 1370 may communicate with the host 2000 through at least one of various interface protocols such as a Universal Serial Bus (USB) protocol, a Multi-Media Card (MMC) protocol, a Peripheral Component Interconnection (PCI) protocol, a PCT express (PCIe) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The flash interface 1380 may communicate with the memory device 100 by using a communication protocol under the control of the processor 1310. Specifically, the flash interface 1380 may communicate a command, an address, and data with the memory device 100 through a channel. For example, the flash interface 1380 may include a NAND interface.

Figure 14:
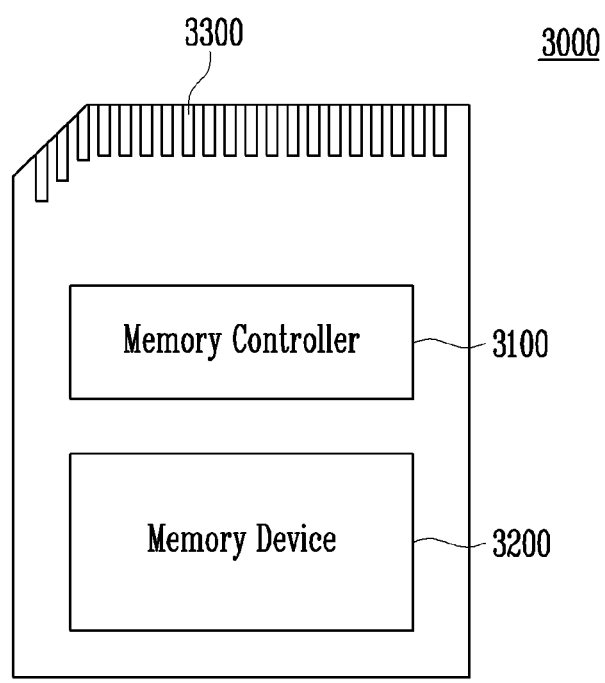
FIG. 14 is a diagram illustrating a memory card system based on an embodiment of the disclosed technology.

FIG. 14 is a diagram illustrating a memory card system based on an embodiment of the disclosed technology.

Referring to FIG. 14, the memory card system 3000 includes a memory controller 3100, a memory device 3200, and a connector 3300.

The memory controller 3100 may be connected to the memory device 3200. The memory controller 3100 may access the memory device 3200. For example, the memory controller 3100 may control read, write, erase, and background operations on the memory device 3200. The memory controller 3100 may provide an interface between the memory device 3200 and a host. Also, the memory controller 3100 may drive firmware for controlling the memory device 3200.

For example, the memory controller 3100 may include components such as a Random Access Memory (RAM), a processing unit, a host interface, a memory interface, and the error corrector.

The memory controller 3100 may communicate with an external device through the connector 3300. The memory controller 3100 may communicate with the external device (e.g., the host) according to a specific communication protocol. In some implementations, the memory controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In some implementations, the memory device 3200 may be implemented with various nonvolatile memory devices such as an Electrically Erasable and Programmable ROM (EEPROM), a NAND flash memory, a NOR flash memory, a Phase-change RAM (PRAM), a Resistive RAM (RRAM), a Ferroelectric RAM (FRAM), and a Spin Torque Transfer magnetic RAM (STT-MRAM).

The memory controller 3100 and the memory device 3200 may be integrated into a single semiconductor device, to constitute a memory card. For example, the memory controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 15:
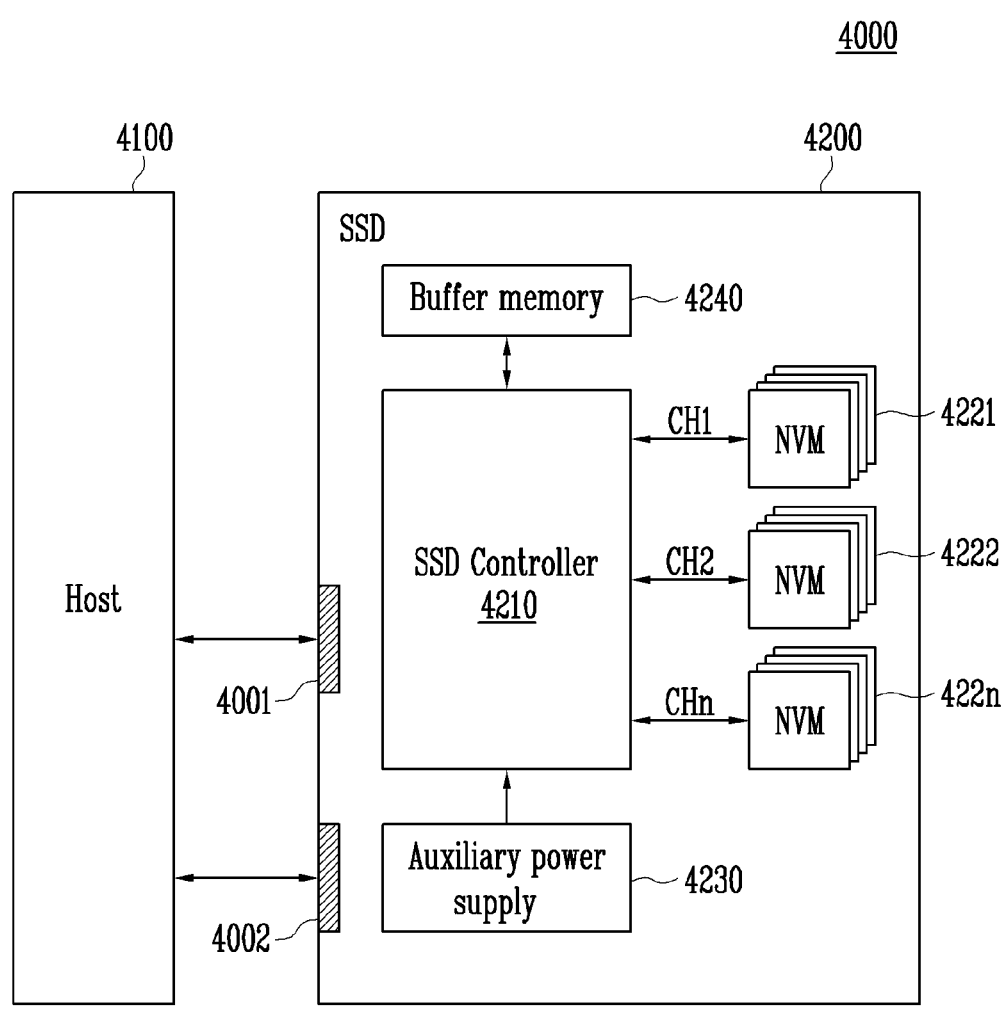
FIG. 15 is a diagram illustrating a Solid State Drive (SSD) based on an embodiment of the disclosed technology.

FIG. 15 is a diagram illustrating a Solid State Drive (SSD) based on an embodiment of the disclosed technology.

Referring to FIG. 15, the SSD system 4000 includes a host 4100 and an SSD 4200. The SSD 4200 exchanges a signal SIG with the host 4100 through a signal connector 4001, and receives power PWR through a power connector 4002. The SSD 4200 includes an SSD controller 4210, a plurality of flash memories 4221 to 422$n$, an auxiliary power supply 4230, and a buffer memory 4240.

In an embodiment, the SSD controller 4210 may serve as the memory controller 200 described with reference to FIG. 1. The SSD controller 4210 may control the plurality of flash memories 4221 to 422$n$ in response to a signal SIG received from the host 4100. In some implementations, the signal SIG may be a signal based on an interface between the host 4100 and the SSD 4200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a Wi-Fi, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. In some implementations, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or temporarily store meta data (e.g., a mapping table) of the flash memories 4221 to 422n. The buffer memory 4240 may include volatile memories such as a DRAM, an SDRAM, a DDR SDRAM, an LPDDR SDRAM, and a GRAM or nonvolatile memories such as a FRAM, a RRAM, an STT-MRAM, and a PRAM.

Figure 16:
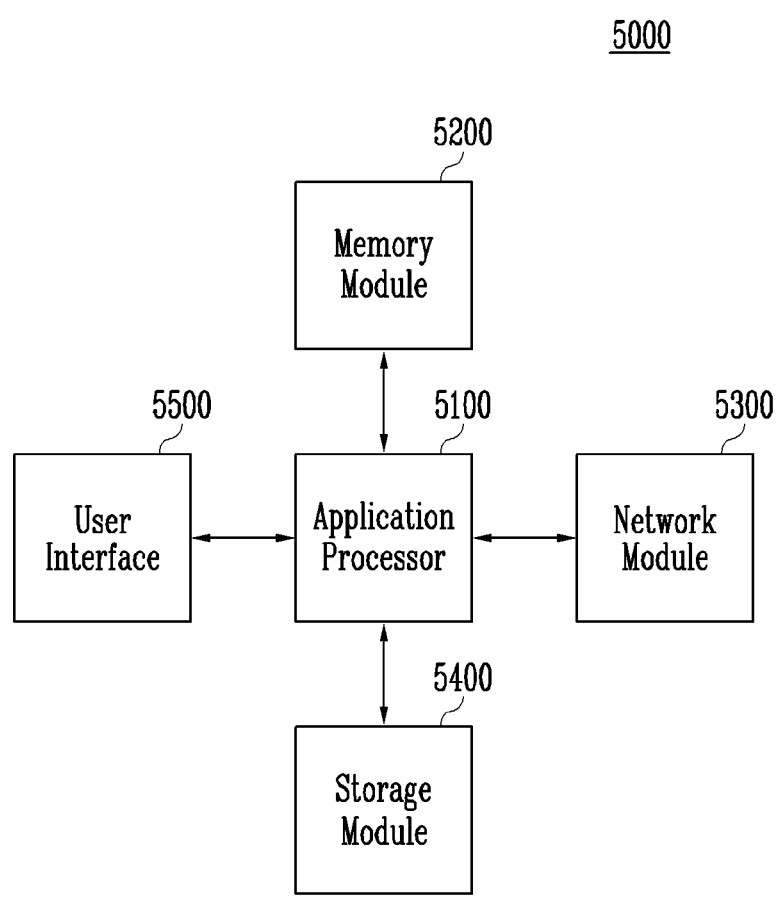
FIG. 16 is a diagram illustrating a user system based on an embodiment of the disclosed technology.

FIG. 16 is a diagram illustrating a user system based on an embodiment of the disclosed technology.

Referring to FIG. 16, the user system 5000 includes an application processor 5100, a memory module 5200, a network module 5300, a storage module 5400, and a user interface 5500.

The application processor 5100 may drive components included in the user system 5000, an operating system (OS), a user program, or the like. In some implementations, the application processor 5100 may include controllers for controlling components included in the user system 5000, interfaces, a graphic engine, and the like. The application processor 5100 may be provided as a System-on-Chip (SoC).

The memory module 5200 may operate as a main memory, working memory, buffer memory or cache memory of the user system 5000. The memory module 5200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a RRAM, an MRAM, and a FRAM. In some implementations, the application processor 5100 and the memory module 5200 may be provided as one semiconductor package by being packaged based on a Package on Package (PoP).

The network module 5300 may communicate with external devices. In some implementations, the network module 5300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In some implementations, the network module 5300 may be included in the application processor 5100.

The storage module 5400 may store data. For example, the storage module 5400 may store data received from the application processor 5100. Alternatively, the storage module 5400 may transmit data stored therein to the application processor 5100. In some implementations, the storage module 5400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In some implementations, the storage module 5400 may be provided as a removable drive such as a memory card of the user system 5000 or an external drive.

In some implementations, the storage module 5400 may include a plurality of nonvolatile memory devices, and the plurality of nonvolatile memory devices may operate identically to the memory device described with reference to FIGS. 1 to 12. The storage module 5400 may operate identically to the storage device 1000 described with reference to FIG. 1.

The user interface 5500 may include interfaces for inputting data or commands to the application processor 5100 or outputting data to an external device. In some implementations, the user interface 5500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 5500 may include user output interfaces such as a Liquid Crystal Display (LCD), an Organic Light Emitting Diode (OLED) display device, an Active Matrix OLED (AMOLED) display device, an LED, a speaker, and a monitor.

In some implementations of the disclosed technology, there can be provided a storage device for performing an improved media scan operation and an operating method of the storage device.

While specific examples of features in certain embodiments of the disclosed technology are described or illustrated in the description and drawings of this patent document, various changes and modifications of the disclosed embodiments and other embodiments may be made based on the disclosure of this patent document.

What is claimed is:

1. A storage device comprising:
a memory device including a plurality of memory blocks for storing data;
a buffer memory device configured to store event information that is associated with a predetermined event occurred including address information of an event page in the plurality of memory blocks that are associated with the predetermined event occurred; and
a memory controller configured to:
upon occurrence of the predetermined event while a write operation is being performed on the plurality of memory blocks, store, in the buffer memory device, the event information for the event page, and control the memory device to perform a test read operation to read at least one page in the plurality of memory blocks except the event page, based on the event information; and
upon failure of the test read operation, control the memory device to perform a migration operation of moving, to a replacement block, data stored in valid pages except a page on which the test read operation has fails among pages included in a memory block on which the test read operation fails.

2. The storage device of claim 1, wherein the memory controller includes an event information manager configured to acquire the address information of the event page and store the address information of the event page in the buffer memory device.

3. The storage device of claim 1, wherein the buffer memory device stores the event information by using a bitmap that maps one or more bits to each of the plurality of memory blocks.

4. The storage device of claim 3, wherein the bitmap includes a plurality of segments to allocate a plurality of word lines to each of the plurality of memory blocks, and
wherein, upon occurrence of the predetermined event, the buffer memory device stores the event information by using a segment to which the event page associated with the predetermined event belongs.

5. The storage device of claim 1, wherein the predetermined event includes a sudden power-off or a partial closure of an open block in which the open block is closed after data is written only to a portion of the open block.

6. The storage device of claim 5, wherein, upon occurrence of the sudden power-off during a write operation in progress on the plurality of memory blocks, the memory controller controls the buffer memory device to store, as the event information, address information of a page on which a last program operation has been performed before the occurrence of the sudden power-off.

7. The storage device of claim 5, wherein, when the partial closure of the open block occurs in a state in which a write operation of the plurality of memory blocks is not completed, the memory controller controls the buffer memory device to store, as the event information, address information of a page on which a last program operation has been performed before the partial closure occurs, and subsequent pages.

8. The storage device of claim 1, wherein the memory controller includes:
 a test read operation controller configured to control the memory device to perform the test read operation to read at least one page in a target block on which the test read operation is to be performed among the plurality of memory blocks; and
 a migration operation controller configured to, upon failure of the test read operation, control the memory device to perform the migration operation to move, to the replacement block, data stored in the valid pages except the page in the target block that has failed the test read operation.

9. The storage device of claim 1, wherein the buffer memory device is a static random access memory.

10. A method for operating a storage device including a plurality of memory blocks, the method comprising:
 upon occurrence a predetermined event while a write operation is being performed in the plurality of memory blocks, storing event information including address information of an event page associated with the predetermined event occurred;
 performing a test read operation to read at least one page in the plurality of memory blocks except the event page, based on the event information; and
 upon failure of the test read operation, performing a migration operation to move, to a replacement block, data stored in valid pages except a page in the plurality of memory blocks that has failed the test read operation.

11. The method of claim 10, wherein the storing of the event information further includes acquiring the address of the event page, and
 wherein the address information of the event page is stored.

12. The method of claim 10, wherein the storing of the event information includes storing the event information by using a bitmap that maps one or more bits to each of the plurality of memory blocks.

13. The method of claim 12, wherein the bitmap includes a plurality of segments to allocate a plurality of word lines to each of the plurality of memory blocks, and
 wherein, upon occurrence of the predetermined event, the event information is stored by using a segment to which the event page associated with the predetermined event belongs.

14. The method of claim 10, wherein the predetermined event includes a sudden power-off or a partial closure of an open block in which the open block is closed after data is written only to a portion of the open block.

15. The method of claim 14, wherein, upon occurrence of the sudden power-off during a write operation in progress on the plurality of memory blocks, address information of a page on which a last program operation has been performed before the occurrence of the sudden power-off is included in the event information which is stored.

16. The method of claim 14, wherein, when the partial closure occurs in a state a write operation of the plurality of memory blocks is not completed, address information of a page on which a last program operation has been performed before the partial closure occurs and subsequent pages are stored as part of the event information.

17. A storage device comprising:
 a memory device including a plurality of memory blocks;
 a buffer memory device in communication with the memory device, and including a bitmap for storing event information associated with the plurality of memory blocks; and
 a memory controller in communication with the memory device and the buffer memory device and configured to read at least one page among a plurality of pages included in the plurality of memory blocks, based on the bitmap, and control the memory device to perform a media scan operation to move stored data, based on a read result,
 wherein, upon occurrence of an event that results in a suspension of a program operation, the memory controller controls the buffer memory device to store, in the bitmap, event information representing a page involving the event,
 wherein the memory controller includes:
 a test read operation controller configured to control the memory device to perform a test read operation that randomly reads at least one page in a target block among the plurality of memory blocks, based on the bitmap; and
 a migration operation controller configured to, upon failure of the test read operation, control the memory device to perform a migration operation to move, to a replacement block, data stored in valid pages except a page in the target block that has failed the test read operation.

18. The storage device of claim 17, wherein the bitmap includes a plurality of segments to allocate a plurality of word lines to each of the plurality of memory blocks, and
 wherein, upon occurrence of the predetermined event, the buffer memory device stores the event information by using a segment to which the event page associated with the event belongs.

19. The storage device of claim 17, wherein the memory controller includes an event information manager configured to, upon occurrence of the event that results in a suspension of a program operation, acquire address information associated with the page involving the event, and control the buffer memory device to store, in the bitmap, the address information as part of the event information.

* * * * *